United States Patent
Samuel et al.

(10) Patent No.: US 10,185,786 B2
(45) Date of Patent: Jan. 22, 2019

(54) METHOD AND ANALYSIS FOR HOLISTIC CASING DESIGN FOR PLANNING AND REAL-TIME

(71) Applicant: Landmark Graphics Corporation, Houston, TX (US)

(72) Inventors: Robello Samuel, Cypress, TX (US); Nitish Chaudhari, Houston, TX (US); Aniket, Houston, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 292 days.

(21) Appl. No.: 14/894,981

(22) PCT Filed: Sep. 30, 2013

(86) PCT No.: PCT/US2013/062690
§ 371 (c)(1),
(2) Date: Nov. 30, 2015

(87) PCT Pub. No.: WO2015/047406
PCT Pub. Date: Apr. 2, 2015

(65) Prior Publication Data
US 2016/0203239 A1 Jul. 14, 2016

(51) Int. Cl.
*G06F 17/50* (2006.01)
*E21B 49/00* (2006.01)
*E21B 43/10* (2006.01)

(52) U.S. Cl.
CPC .............. *G06F 17/50* (2013.01); *E21B 43/10* (2013.01); *E21B 49/003* (2013.01)

(58) Field of Classification Search
CPC ....................................................... G06F 17/50

USPC ............................................................ 703/1
See application file for complete search history.

(56) References Cited

U.S. PATENT DOCUMENTS

| | | | | |
|---|---|---|---|---|
| 6,892,819 | B2* | 5/2005 | Cook | B21D 39/203 166/207 |
| 8,229,671 | B2* | 7/2012 | Pritchard | E21B 21/08 702/6 |
| 8,812,334 | B2* | 8/2014 | Givens | G06Q 10/06 166/250.16 |

(Continued)

OTHER PUBLICATIONS

International Search Report and Written Opinion, Jun. 24, 2014, 9 pages, Korean International Searching Authority.

(Continued)

*Primary Examiner* — Andy Ho (57) ABSTRACT

The disclosed embodiments include a method, apparatus, and computer program product for determining a suitable casing design for a well. For example, one disclosed embodiment includes a system that includes at least one processor and at least one memory coupled to the at least one processor and storing instructions that when executed by the at least one processor performs operations for receiving historical data associated with previously drilled wells; in response to a determination that the historical data associated with previously drilled well is relevant to the well, generating a first set of casing designs using a probabilistic approach and generating a second set of casing designs using a combination approach that combines the probabilistic approach with a deterministic approach; and selecting a suitable casing design from a resulting set of casing designs.

20 Claims, 6 Drawing Sheets

(56) References Cited

U.S. PATENT DOCUMENTS

| | | |
|---|---|---|
| 9,202,175 B2 * | 12/2015 | Al-Yami ................ E21B 44/00 |
| 2008/0289875 A1 | 11/2008 | Burge et al. |
| 2010/0088078 A1 | 4/2010 | Geehan et al. |
| 2010/0191516 A1 | 7/2010 | Benish et al. |
| 2010/0204972 A1 | 8/2010 | Hsu et al. |
| 2011/0106514 A1 | 5/2011 | Omeragic et al. |

OTHER PUBLICATIONS

Canadian Intellectual Property Office, Examination Report, dated Nov. 27, 2017, 3 pages, Canada.
Daniel Moos, Pavel Peska, Thomas Finkbeiner and Mark Zoback, Comprehensive Wellbore Stability Analysis Utilizing Quantitative Risk Assessment, Journal of Petroleum Science and Engineering, Jun. 2003, 14 pages, vol. 38, Palo Alto, California.

* cited by examiner

METHOD AND ANALYSIS FOR HOLISTIC CASING DESIGN FOR PLANNING AND REAL-TIME

CROSS-REFERENCE TO RELATED APPLICATIONS

This application is a U.S. National Stage patent application of International Patent Application No. PCT/US2013/062690, filed on Sep. 30, 2013, the benefit of which is claimed and the disclosure of which is incorporated herein by reference in its entirety.

BACKGROUND OF THE INVENTION

1. Field of the Invention

The present invention generally relates to the field of hydrocarbon recovery, and more particularly, to a system and method configured to determine a suitable casing design for a given well.

2. Discussion of the Related Art

Once a well has been drilled, if it is to become a production well, the well must undergo completion. While drilling a well cuts through the rock formations and allows drilling engineers to reach the reservoir below, the raw sides of the well cannot support themselves. Therefore, one or more tubing/steel pipes (referred to as casing) are set inside the drilled well to protect and support the well stream. The casing forms a major structural component of the wellbore and serves several important functions including preventing the formation wall from caving into the wellbore, isolating the different formations to prevent the flow or cross-flow of formation fluid, and providing a means of maintaining control of formation fluids and pressure as the well is drilled. The well designer must design casing to withstand a variety of forces, such as collapse, burst, and tensile failure, as well as chemically aggressive brines.

The disclosed embodiments seek to improve the process of casing design by providing a computer-implemented method, system, and computer program product that is configured to determine a suitable casing design for a well.

BRIEF DESCRIPTION OF THE DRAWINGS

Illustrative embodiments of the present invention are described in detail below with reference to the attached drawing figures, which are incorporated by reference herein and wherein.

DETAILED DESCRIPTION

The disclosed embodiments seek to improve the casing design methods currently used in the industry by using real-time data, historical data, and new computing methods for performing a deterministic, a probabilistic, and/or a combination of the deterministic and probabilistic design methods.

Currently, there are two different casing design models, deterministic and probabilistic. A deterministic model is one in which every set of variable states is uniquely determined by parameters in the model and by sets of previous states of these variables. Therefore, deterministic models perform the same way for a given set of initial conditions. For example, in casing design, the deterministic approach uses minimum strengths and performance properties of the pipe material, hypothetical loading scenarios, and engineering calculations for analyzing structural performance. Based on these calculations, plus additional safety factors for contingency to safely sustain loads, the types and sizes of casing pipes are decided.

Conversely, in a probabilistic approach/model, randomness is present, and variable states are not described by unique values, but rather by probability distributions. For example, with respect to casing design, the probabilistic approach uses statistical data for the strengths and properties of actual materials. This approach works around probabilistic loading scenarios and accounts for the consequences of failure along with various probability factors.

The present disclosure seeks to improve the process of casing design by proposing that for any new field, a computer-implemented casing design process begins with a deterministic approach. Once sufficient statistical data is gathered, the computer-implemented casing design process initiates a probabilistic approach, working on both the deterministic casing design approach and the probabilistic casing design approach side by side, and selecting the most suitable design. In certain embodiments, the computer-implemented casing design process may also run a combination design in which the deterministic approach is integrated with the probabilistic approach, and selecting between the three different casing designs.

The disclosed embodiments and advantages thereof are best understood by referring to FIGS. 1-8 of the drawings, like numerals being used for like and corresponding parts of the various drawings. Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only exemplary and are not intended to assert or imply any limitation with regard to the environment, architecture, design, or process in which different embodiments may be implemented.

Figure 1:
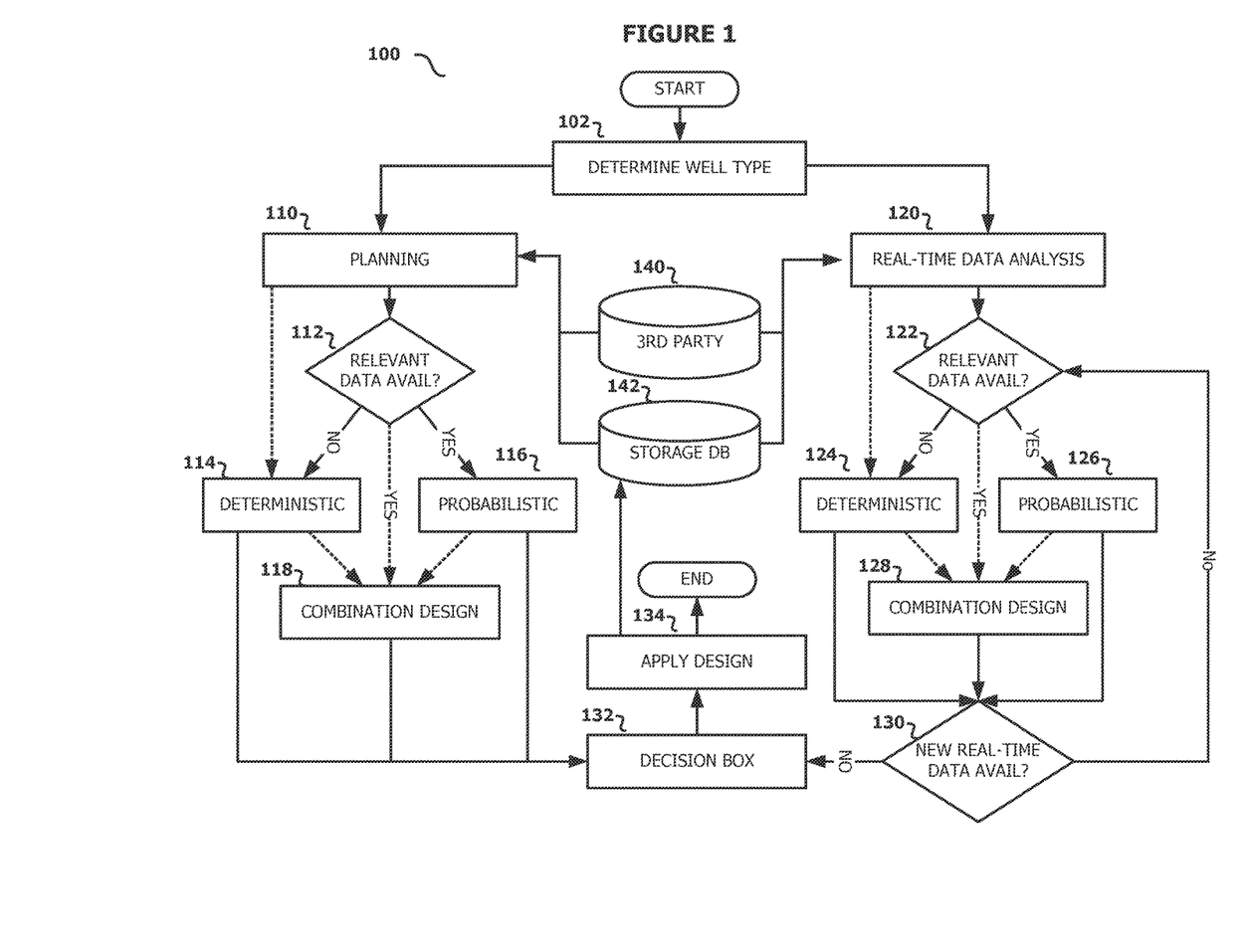
FIG. 1 is a flowchart illustrating an example of a computer implemented method for determining a suitable casing design for a well in accordance with the disclosed embodiments.

FIG. 1 is a flowchart illustrating an example of a computer implemented method (process 100) for determining a suitable casing design for a well in accordance with the disclosed embodiments. The process begins at step 102 by determining a well type in which a casing design is intended for, as casing specifications vary based on the different types of wells. Examples of the different well types are vertical wells, deviated wells, and horizontal wells. In one embodiment, a user selects/indicates a particular well type as one of many configuration parameters for performing the process 100.

Once the well type is determined, if the well is not currently being drilled, the process proceeds to a planning stage 110. However, if the well is currently being drilled, the process proceeds to a real-time data analysis stage 120. In one embodiment, a user can indicate in a set of configuration parameters whether the well is currently being drilled or whether the well is in the planning stage. During both the planning stage 110 and the real-time data analysis stage 120, the process imports data from one or more databases, such as, but not limited to, a third party database 140 and/or one or more internal storage databases 142. Non-limiting examples of the types of information that may be imported by the process 100 includes historical data regarding previously drilled wells and their corresponding casing design information.

Proceeding with the planning stage 110, in one embodiment, the process proceeds to step 112 and determines whether any relevant data exist from the information that is imported from the one or more databases. Relevant data include, but is not limited to, casing design parameters for drilled wells of similar type. Non-limiting examples of casing design parameters include downhole pressure, pore pressure, fracture pressure, pressure behind the zone of isolation, the rate that the casing is run, formation temperature, formation pressure, operating parameters, well path tortuosity, and manufacturing process. In addition to casing design parameters, information regarding previously encountered issues/problems or other well parameters associated with the previously drilled wells may be relevant to the current casing design. As will be further discussed, the disclosed embodiments use the relevant data to improve the casing design by adjusting certain weighting factors.

In one embodiment, if the process determines the relevant data exist, the process proceeds to step 116 and performs a probabilistic approach for casing design. If the process determines that no relevant data exist, the process proceeds to step 114 and performs a deterministic approach to casing design. Optionally, in certain embodiments, the process 100 may proceed directly to step 114 and perform the deterministic approach to casing design without checking for any relevant data at step 112.

Additionally, in certain embodiments, if relevant data exist, the process 100 may be configured to automatically perform at step 118 a single combination design using both a deterministic approach and a probabilistic approach. Alternatively, in certain embodiments, if relevant data exist, the process 100 may be configured to perform all three design approach types (i.e., a deterministic approach using no historical relevant data, a probabilistic approach using historical relevant data, and a combination design approach that combines both the deterministic approach and the probabilistic approach).

Each of the casing designs is then fed into a decision box 132, which applies an algorithm for determining the suitable designs for the determined well type. At step 134, the process applies a selected design casing for the well. Information regarding the selected design casing may then be stored for use in future casing designs.

With reference now to the real-time data analysis stage 120, the process is configured to perform a similar process as described above for the planning stage 110 in that relevant data is checked at step 122, and at least one of a deterministic, probabilistic, and combination casing design approach (steps 124, 126, and 128) is performed. However, in contrast to the planning stage 110, during the real-time data analysis stage 120, the process queries for real-time data determined during the drilling process at step 130. In accordance with the disclosed embodiments, the real-time data may be gathered by any variety of methods such as using tools that are delivered downhole via wireline or alternatively using tools that are coupled to or integrated into a drill string of a drilling rig. If real-time data is available, the process determines whether the received real-time data is relevant to the casing design at step 122, and if so, uses the real-time data to update the one or more casing design approach. The process continues to update the casing design as long as real-time data is available at step 130. Once no new real-time data is available, the process proceeds similarly to decision box 132 as described above.

Figure 2:
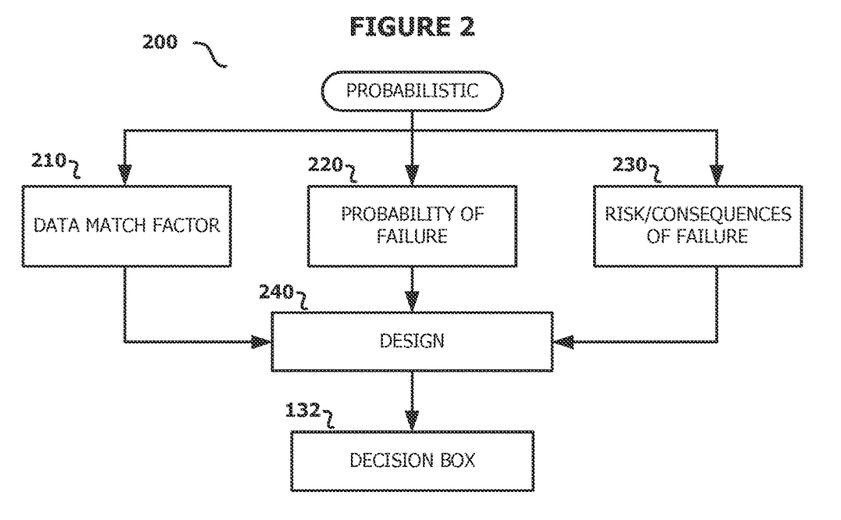
FIG. 2 is a flowchart illustrating an example of a computer implemented method for determining a suitable casing design for a well using a probabilistic approach in accordance with the disclosed embodiments.

FIG. 2 is a flowchart illustrating an example of a computer implemented method for determining a suitable casing design for a well using a probabilistic approach 200 in accordance with the disclosed embodiments. In the depicted embodiment, the probabilistic approach 200 performs a data match factor process at step 210, determines a probability of failure at step 220, and determines the risk/consequences of failure at step 230 in determining one or more suitable casing designs at step 240. As depicted in FIG. 1, the one or more probabilistic casing designs are then fed into the decision box 132.

Figure 3:
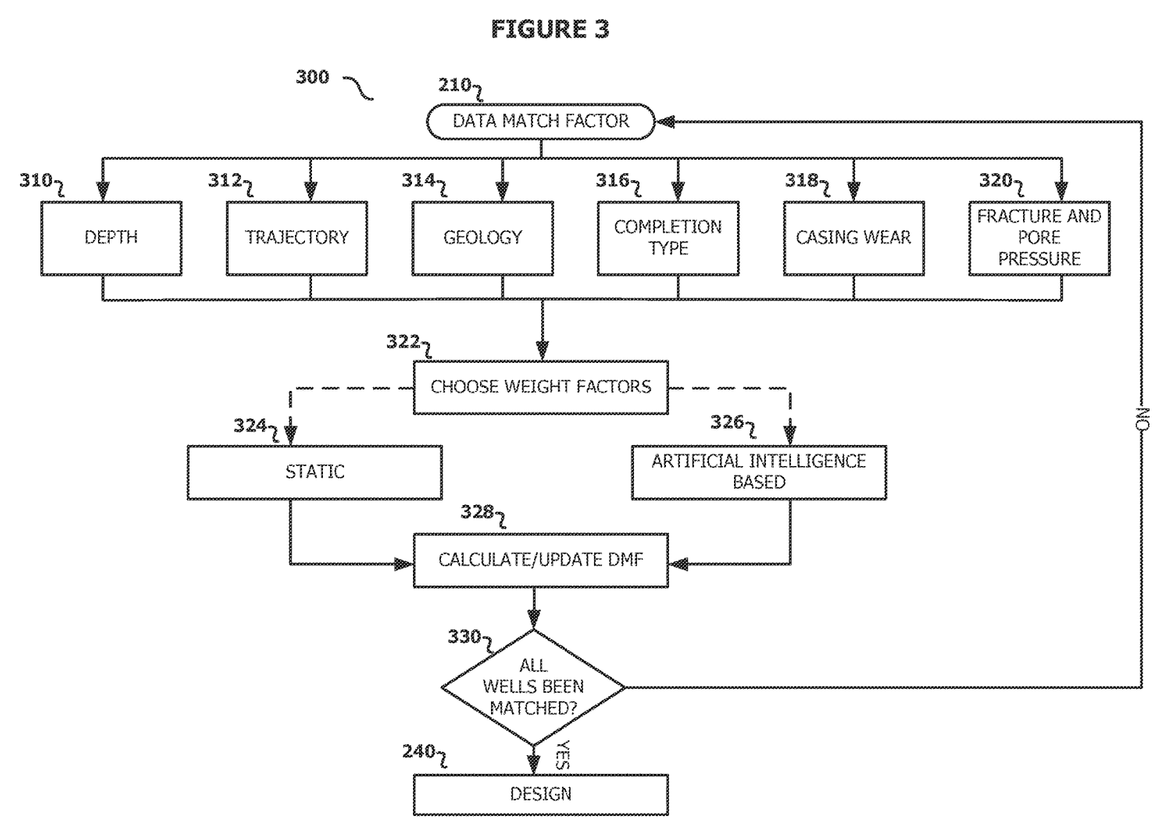
FIG. 3 is a flowchart illustrating an example of a computer implemented method for determining a data match factor in accordance with the disclosed embodiments.

In regard to the data match factor process at step 210, reference is made to FIG. 3, which illustrates a flowchart that depicts an example of a computer implemented method 300 for determining a data match factor in accordance with the disclosed embodiments. The data match factor process uses historical data for the same type of wells to improve the casing design for the current well. For example, in one embodiment, the data match factor determines how similar a previously drilled well is to the current well for enabling the use of the casing design parameters from the previously drilled well to improve upon the casing design for the current well by quantifying the uncertainties based on matching other casings/wells.

In the depicted embodiment, the process 300 uses several well factors/parameters in determining the data match factor including, but not limited to, a depth parameter 310, a trajectory parameter 312, a geology factor 314, a completion type factor 316, a casing wear factor 318, and a fracture and pore pressure factor 320. As previously described, the data match factor will be higher for previous wells/casings that have similar parameters. For example, the data match factor is higher for wells having similar fracture and pore pressure (factor 320) and that are completed (factor 316) in the same way (e.g., multi-feed completion, multi-oil completion). Additionally, the data match factor may decrease if there is high casing wear (factor 318). The casing wear factor 318 accounts for wear in the well when the drill string contacts the inside wall of the casing. High casing wear is an indicator of reduction in casing strength and should be correctly accounted for in the current casing design.

At step 322, the process chooses weight factors to apply to each of the above factors/parameters. In one embodiment, the process 300 may apply a static weight factor at step 324.

Alternatively, or in addition to, in certain embodiments, the process may apply an artificial intelligence based weighting factor to one or more of the above factors/parameters at step 326 (e.g., using artificial neural network and fuzzy logic). For instance, as the process receives more information about the same type of wells, the process may adjust one or more of the weighting factors to improve the probability of a factor/parameter. As an example, the process may automatically increase the level of confidence associated with a factor that was previously assigned a 30% level of confidence if no problems associated with this factor/parameter has been encountered based on the historical data. In other words, factors/parameters that are more certain or concrete than others are given a higher weight.

At step 328, the process calculates/updates the data match factor. The process at step 330 then determines whether all wells have been matched. If additional well information is available, the process repeats the data match factor process using the additional well information. Once all wells have been matched, the process proceeds to the design step 240 as indicated in FIG. 2.

Figure 4:
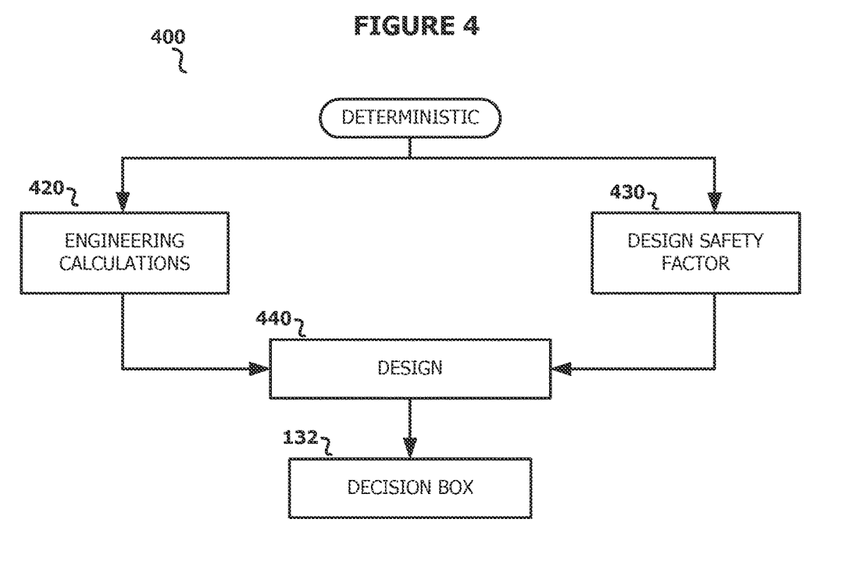
FIG. 4 is a flowchart illustrating an example of a computer implemented method for determining a suitable casing design for a well using a deterministic approach in accordance with the disclosed embodiments.

With reference now to FIG. 4, a flowchart is depicted illustrating an example of a computer implemented method for determining a suitable casing design for a well using a deterministic approach 400 in accordance with the disclosed embodiments. In the depicted embodiment, the deterministic approach 400 performs engineering calculations at step 420 and determines design safety factors at step 430 in determining one or more suitable casing designs at step 440. For example, in one embodiment, the deterministic approach 400 is configured to perform engineering calculations that include, but are not limited to, calculating the loads imposed on different types of designs (e.g., determining burst load, collapse load, axial tension load) and determining the maximum permissible vertical depth. Axial tension load results primarily from the weight of the casing string being suspended below the joint of interest. Burst load is the calculated minimum internal pressure that will cause the casing to rupture in the absence of external pressure and axial loading. Collapse load is the minimum external pressure that will cause the casing walls to collapse in the absence of internal pressure and axial loading. The American Petroleum Institute (API) provides recommended formulas for computing these performance properties.

Figure 5:
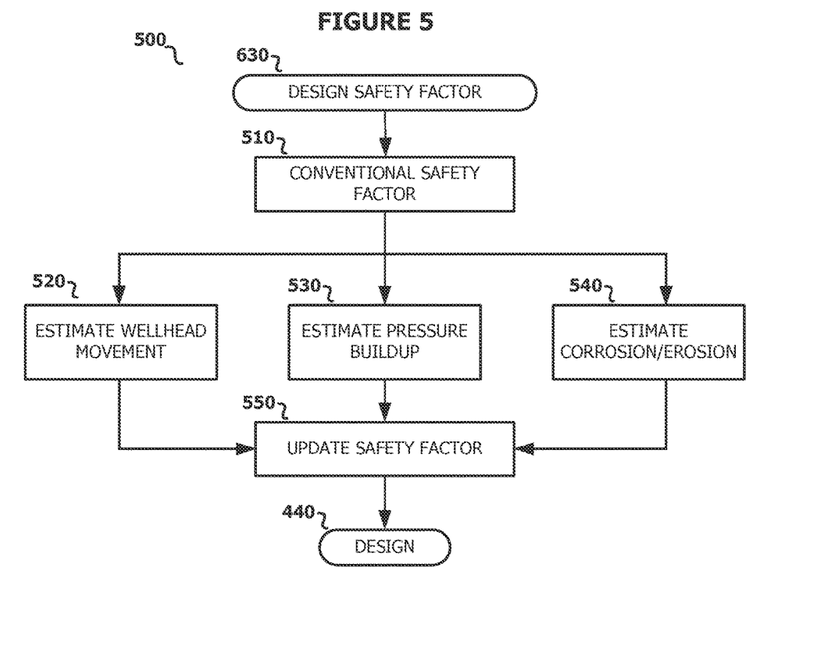
FIG. 5 is a flowchart illustrating an example of a computer implemented method for determining a design safety factor in accordance with the disclosed embodiments.

The design safety factors (step 430) vary for different well types and well parameters. For example, FIG. 5 illustrates a flowchart depicting an example of a computer implemented method 500 for determining design safety factors in accordance with the disclosed embodiments. The design safety factor, in addition to the regular safety factors, adds safety factors to account for casing integrity. In the depicted embodiment, the design safety factor 630 is determined by taking into account conventional safety factors 510, which includes determining an estimated wellhead movement at step 520, determining an estimate of the pressure buildup at step 530, and determining an estimate of corrosion/erosion at step 540. The process 500 then updates the safety factor at step 550. In certain embodiments, the design safety factors may be incorporated into the engineering calculations performed at step 420 indicated in FIG. 4. For example, in one embodiment, design safety factors that pose a higher risk level (e.g., burst—risk of life) are given a higher safety factor in the calculations than lower risk level safety design factors (e.g., collapse—risk of losing a section of the well).

Using the above calculations and design safety factors, the deterministic approach 400 is configured to determine one or more suitable casing designs. The one or more deterministic casing designs are then fed into the decision box 132 as depicted in FIG. 1.

Figure 6:
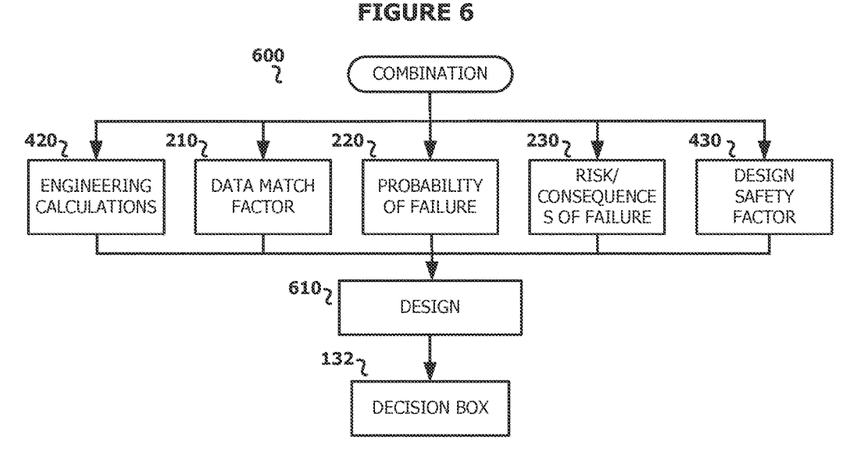
FIG. 6 is a flowchart illustrating an example of a computer implemented method for determining a suitable casing design for a well using a combination approach in accordance with the disclosed embodiments.

Additionally, as stated above, during both the planning stage 110 and the real-time data analysis stage 120, if relevant data exist, the process 100 may be configured to automatically perform, either alone or in conjunction with performing a deterministic and/or probabilistic approach, a combination design that combines both the deterministic approach and the probabilistic approach as depicted in FIG. 6.

Figure 7:
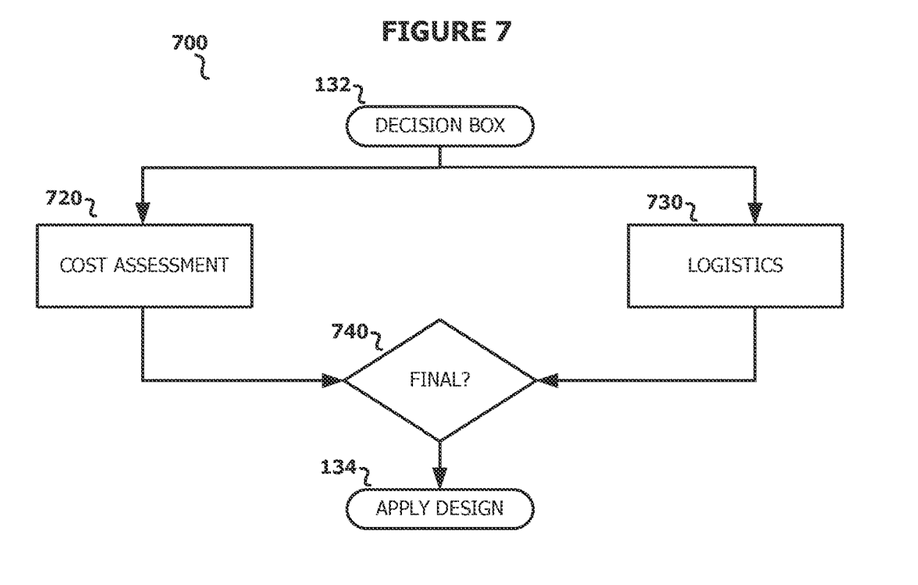
FIG. 7 is a flowchart illustrating an example of a computer implemented method for determining a suitable casing design for a well in accordance with the disclosed embodiments.

FIG. 7 is a flowchart illustrating an example of a computer implemented method (process 700) for implementing the decision box 132 as depicted in FIG. 1. In the depicted embodiment, the decision box 132 includes a cost assessment component 720 and a logistics component 730 that is both used to make a final determination of one or more suitable casing designs for the well at step 740.

In one embodiment, the cost assessment component 720 determines a cost estimate for each of the suitable casing designs. Additionally, in certain embodiments, the cost assessment component 720 may be configured to provide a risk versus cost assessment for each of the suitable casing designs. For example, in one embodiment, the cost assessment component 720 may be configured to take into account a suggested designs' strength, collapse, and burst pressure ratings.

In one embodiment, the logistics component 730 performs an analysis on each design to account for procurement cost including the cost to attain material, manufacture the casing, available inventory versus available time frame, the logistics involved in delivering the casing to the well location and installing the particular casing design.

Using the above components, the process 700 may be configured to provide a list of one or more suitable casing designs for the well along with their corresponding cost estimate. In certain embodiments, the one or more suitable casing designs include, but are not limited to, the grade of casing material to use (as graded by the API), the outside and inside diameters, wall thickness, drift diameter, and a collapse resistance. In certain embodiments, the process 700 may also be configured to provide a ranking of the one or more suitable casing designs for the well based on one or more predetermined factors.

Figure 8:
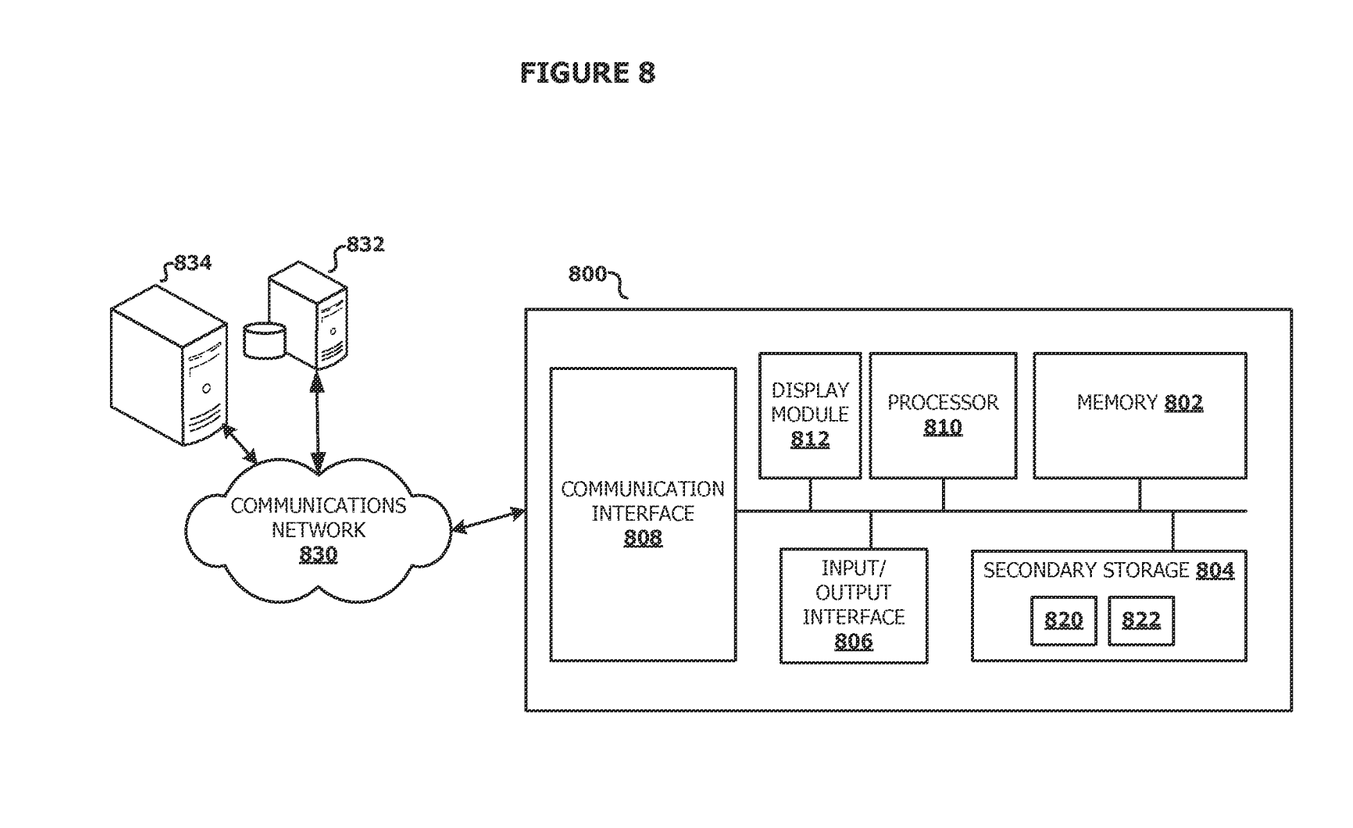
FIG. 8 is a block diagram illustrating one embodiment of a system for implementing the disclosed embodiments.

FIG. 8 is a block diagram illustrating one embodiment of a system 800 for implementing the features and functions of the disclosed embodiments. The system 800 includes, among other components, a processor 810, main memory 802, secondary storage unit 804, an input/output interface module 806, and a communication interface module 808. The processor 810 may be any type or any number of single core or multi-core processors capable of executing instructions for performing the features and functions of the disclosed embodiments.

The input/output interface module 806 enables the system 800 to receive user input (e.g., from a keyboard and mouse) and output information to one or more devices such as, but not limited to, printers, external data storage devices, and audio speakers. The system 800 may optionally include a separate display module 812 to enable information to be displayed on an integrated or external display device. For instance, the display module 812 may include instructions or hardware (e.g., a graphics card or chip) for providing enhanced graphics, touchscreen, and/or multi-touch functionalities associated with one or more display devices.

Main memory 802 is volatile memory that stores currently executing instructions/data or instructions/data that are prefetched for execution. The secondary storage unit 804 is non-volatile memory for storing persistent data. The secondary storage unit 804 may be or include any type of data storage component such as a hard drive, a flash drive, or a memory card. In one embodiment, the secondary storage unit 804 stores the computer executable code/instructions and other relevant data for enabling a user to perform the features and functions of the disclosed embodiments.

For example, in accordance with the disclosed embodiments, the secondary storage unit 804 may permanently store the executable code/instructions associated with a casing design application 820 for performing the above-described methods. The instructions associated with the casing design algorithm 820 are loaded from the secondary storage unit 804 to main memory 802 during execution by the processor 810 for performing the disclosed embodiments.

The communication interface module 808 enables the system 800 to communicate with the communications network 830. For example, the network interface module 808 may include a network interface card and/or a wireless transceiver for enabling the system 800 to send and receive data through the communications network 830 and/or directly with other devices.

The communications network 830 may be any type of network including a combination of one or more of the following networks: a wide area network, a local area network, one or more private networks, the Internet, a telephone network such as the public switched telephone network (PSTN), one or more cellular networks, and wireless data networks. The communications network 830 may include a plurality of network nodes (not depicted) such as routers, network access points/gateways, switches, DNS servers, proxy servers, and other network nodes for assisting in routing of data/communications between devices.

For example, in one embodiment, the system 800 may interact with one or more servers 834 or databases 832 for performing the features of the present invention. For instance, the system 800 may query the database 832 to obtain historical well and casing design parameters in accordance with the disclosed embodiments. Further, in certain embodiments, the system 800 may act as a server system for one or more client devices or a peer system for peer to peer communications or parallel processing with one or more devices/computing systems (e.g., clusters, grids).

Thus, the disclosed embodiments provide a process for determining a suitable casing design for a well. Advantages of the disclosed embodiments include, but are not limited to, providing a safer, more economical, and justified casing design that is individually specialized for specific fields that would lead to fewer failures at lower casing costs for clients.

While specific details about the above embodiments have been described, the above hardware and software descriptions are intended merely as example embodiments and are not intended to limit the structure or implementation of the disclosed embodiments. For instance, although many other internal components of the system 800 are not shown, those of ordinary skill in the art will appreciate that such components and their interconnection are well known.

In addition, certain aspects of the disclosed embodiments, as outlined above, may be embodied in software that is executed using one or more processing units/components. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the software programming.

Additionally, the flowchart and block diagrams in the figures illustrate the architecture, functionality, and operation of possible implementations of systems, methods and computer program products according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Accordingly, the disclosed embodiments include a method, apparatus, and computer program product for determining a suitable casing design for a well. In addition to the embodiments described above, many examples of specific combinations are within the scope of the disclosure, some of which are detailed below.

For instance, one example is a computer-implemented method that includes the steps of receiving historical data associated with previously drilled wells, determining whether the historical data associated with the previously drilled wells is relevant to the well, in response to a determination that the historical data associated with previously drilled well is relevant to the well, generating a first set of casing designs using a probabilistic approach and generating a second set of casing designs using a combination approach that combines the probabilistic approach with a deterministic approach, and selecting the suitable casing design from a resulting set of casing designs, wherein the resulting set of casing designs includes the first set of casing designs and the second set of casing designs.

In certain embodiments, the computer-implemented method may also generate a third set of casing designs using the deterministic approach. The computer-implemented method would then select the suitable casing design from the first, second, and third sets of casing designs.

The above computer-implemented method may be performed during a planning stage of the well and/or during a drilling stage of the well. For example, in certain embodiments, during the drilling stage of the well, the computer-implemented method may receive real-time data during drilling of the well, determine whether the real-time data is relevant to determining the suitable casing design for the well; and in response to a determination that the real-time data is relevant to determining the suitable casing design for the well, and update the first set of casing designs using the probabilistic approach and the second set of designs using the combination approach.

In one embodiment, the computer-implemented method using the probabilistic approach generates casing designs using a data match factor, a probability of failure, and a consequence of failure. In one embodiment, the computer-implemented method determines the data match factor by comparing a set of parameters from a previously drilled well to that of the well. Non-limiting examples of the types of parameters that are compared are described above.

Additionally, in some embodiments, one or more of the parameters within the set of parameters are assigned a weighting factor. For example, the weighting factor may be based on a level of confidence associated with a particular parameter. In certain embodiments, the weighting factor may be static (i.e., constant). In other embodiments, the weighting factor may be dynamic in that it may vary. For instance, in certain embodiments, the weighting factor may be determined using artificial intelligence such as artificial neural networks and fuzzy logic.

In addition, in some embodiments, the computer-implemented method using the deterministic approach generates casing designs using engineering calculations and accounts for design safety factors. For example, in one embodiment, the design safety factors include an estimated wellhead movement, an estimated pressure buildup, and an estimated corrosion of the well.

A second example of a disclosed embodiment is a non-transitory computer readable medium comprising computer executable instructions for determining a suitable casing design for a well. For example, in one embodiment, the computer executable instructions when executed causes one or more machines to perform operations comprising receiving historical data associated with previously drilled wells, determining whether the historical data associated with the previously drilled wells is relevant to the well, in response to a determination that the historical data associated with previously drilled well is relevant to the well, generating a first set of casing designs using a probabilistic approach and generating a second set of casing designs using a combination approach that combines the probabilistic approach with a deterministic approach, and selecting the suitable casing design from a resulting set of casing designs, wherein the resulting set of casing designs includes the first set of casing designs and the second set of casing designs. In certain embodiments, the operations may also include generating a third set of casing designs using the deterministic approach, and wherein the resulting set of casing design includes the third set of casing designs.

Still, in certain embodiments, the computer executable instructions of the non-transitory computer readable medium when executed further causes one or more machines to perform operations comprising receiving real-time data during a drilling stage of the well; determining whether the real-time data is relevant to determining the suitable casing design for the well; and in response to a determination that the real-time data is relevant to determining the suitable casing design for the well, updating the first set of casing designs using the probabilistic approach and updating the second set of designs using the combination approach.

In one embodiment, the computer executable instructions of the probabilistic approach generates casing designs using a data match factor, a probability of failure, and a consequence of failure. The data match factor may be generated by comparing a set of parameters from a previously drilled well to that of the well. The parameters within the set of parameters may be assigned a weighting factor. Still, in certain embodiments, the weighting factor for a parameter associated with the previously drilled well may be dynamically updated based on the real-time data.

A third example is a system that includes at least one processor and at least one memory coupled to the at least one processor and storing instructions that when executed by the at least one processor performs operations comprising receiving historical data associated with previously drilled wells; determining whether the historical data associated with the previously drilled wells is relevant to the well; in response to a determination that the historical data associated with previously drilled well is relevant to the well, generating a first set of casing designs using a probabilistic approach and generating a second set of casing designs using a combination approach that combines the probabilistic approach with a deterministic approach; and selecting the suitable casing design from a resulting set of casing designs, wherein the resulting set of casing designs includes the first set of casing designs and the second set of casing designs.

The above system embodiment may further include operations comprising, but not limited to, generating a third set of casing designs using the deterministic approach and updating the first and the second set of designs using the combination approach in response to receiving relevant real-time data.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described to explain the principles of the invention and the practical application, and to enable others of ordinary skill in the art to understand the invention for various embodiments with various modifications as are suited to the particular use contemplated. The scope of the claims is intended to broadly cover the disclosed embodiments and any such modification.

The invention claimed is:

1. A computer-implemented method for determining a suitable casing design for a well, the method comprising:
   receiving historical data associated with previously drilled wells;
   determining whether the historical data associated with the previously drilled wells is relevant to the well;
   in response to a determination that the historical data associated with previously drilled well is relevant to the well, generating a first set of casing designs using a probabilistic approach and generating a second set of casing designs using a combination approach, wherein the combination approach combines the probabilistic approach with a deterministic approach; and
   selecting the suitable casing design from a resulting set of casing designs, wherein the resulting set of casing designs includes the first set of casing designs and the second set of casing designs.

2. The computer-implemented method of claim 1, further comprising generating a third set of casing designs using the deterministic approach, and wherein the resulting set of casing designs includes the third set of casing designs.

3. The computer-implemented method of claim 2, wherein determining the suitable casing design for the well is performed during a planning stage of the well.

4. The computer-implemented method of claim 2, wherein determining the suitable casing design for the well is performed during a drilling stage of the well.

5. The computer-implemented method of claim 4, further comprising:
receiving real-time data during the drilling stage of the well;
determining whether the real-time data is relevant to determining the suitable casing design for the well; and
in response to a determination that the real-time data is relevant to determining the suitable casing design for the well, updating the first set of casing designs that used the probabilistic approach and updating the second set of casing designs that used the combination approach.

6. The computer-implemented method of claim 1, wherein the probabilistic approach generates casing designs using a data match factor, a probability of failure, and a consequence of failure.

7. The computer-implemented method of claim 6, wherein generating the data match factor comprises comparing a set of parameters from a previously drilled well to that of the well, and wherein parameters within the set of parameters are assigned a weighting factor.

8. The computer-implemented method of claim 7, wherein the weighting factor for a parameter associated with the previously drilled well is determined using artificial intelligence.

9. The computer-implemented method of claim 2, wherein the deterministic approach generates casing designs using engineering calculations and accounts for design safety factors.

10. The computer-implemented method of claim 9, wherein the design safety factors include an estimated wellhead movement, an estimated-pressure buildup, and an estimated corrosion of the well.

11. A non-transitory computer readable medium comprising computer executable instructions for determining a suitable casing design for a well, the computer executable instructions when executed causes one or more machines to perform operations comprising:
receiving historical data associated with previously drilled wells;
determining whether the historical data associated with the previously drilled wells is relevant to the well;
generating a first set of casing designs using a probabilistic approach and generating a second set of casing designs using a combination approach in response to a determination that the historical data associated with previously drilled well is relevant to the well, wherein the combination approach combines the probabilistic approach with a deterministic approach; and
selecting the suitable casing design from a resulting set of casing designs, wherein the resulting set of casing designs includes the first set of casing designs and the second set of casing designs.

12. The computer readable medium of claim 11, wherein the operations further comprises generating a third set of casing designs using the deterministic approach, and wherein the resulting set of casing designs includes the third set of casing designs.

13. The computer readable medium of claim 12, wherein the operations further comprises determining the suitable casing design for the well is executed during a drilling stage of the well.

14. The computer readable medium of claim 13, wherein the operations further comprises:
receiving real-time data during the drilling stage of the well;
determining whether the real-time data is relevant to determining the suitable casing design for the well; and
in response to a determination that the real-time data is relevant to determining the suitable casing design for the well, updating the first set of casing designs using the probabilistic approach and updating the second set of casing designs using the combination approach.

15. The computer readable medium of claim 14, wherein the probabilistic approach generates casing designs using a data match factor, a probability of failure, and a consequence of failure, wherein generating the data match factor comprises comparing a set of parameters from a previously drilled well to that of the well, wherein parameters within the set of parameters are assigned a weighting factor, and wherein the weighting factor for a parameter associated with the previously drilled well is dynamically updated based on the real-time data.

16. A system, comprising:
at least one processor; and
at least one memory coupled to the at least one processor and storing instructions that when executed by the at least one processor performs operations comprising:
receiving historical data associated with previously drilled wells;
determining whether the historical data associated with the previously drilled wells is relevant to a well;
in response to a determination that the historical data associated with previously drilled well is relevant to the well, generating a first set of casing designs using a probabilistic approach and generating a second set of casing designs using a combination approach, wherein the combination approach combines the probabilistic approach with a deterministic approach; and
selecting a suitable casing design from a resulting set of casing designs, wherein the resulting set of casing designs includes the first set of casing designs and the second set of casing designs.

17. The system of claim 16, wherein the operations further comprises generating a third set of casing designs using the deterministic approach, and wherein the resulting set of casing designs includes the third set of casing designs.

18. The system of claim 16, wherein the operations further comprises:
receiving real-time data during a drilling stage of the well;
determining whether the real-time data is relevant to determining the suitable casing design for the well; and
in response to a determination that the real-time data is relevant to determining the suitable casing design for the well, updating the first set of casing designs using the probabilistic approach and updating the second set of casing designs using the combination approach.

19. The system of claim 16, wherein the probabilistic approach generates casing designs using a data match factor, a probability of failure, and a consequence of failure.

20. The system of claim 19, wherein generating the data match factor comprises comparing a set of parameters from a previously drilled well to that of the well, and wherein parameters within the set of parameters are assigned a weighting factor.

* * * * *